(12) United States Patent
Philipp et al.

(10) Patent No.: US 9,081,572 B2
(45) Date of Patent: *Jul. 14, 2015

(54) PROXIMITY SENSOR

(71) Applicant: Atmel Corporation, San Jose, CA (US)

(72) Inventors: Harald Philipp, Zug (CH); Kevin Snoad, Chicester (GB)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/299,032

(22) Filed: Jun. 9, 2014

(65) Prior Publication Data

US 2014/0292716 A1    Oct. 2, 2014

Related U.S. Application Data

(63) Continuation of application No. 13/116,764, filed on May 26, 2011, now Pat. No. 8,749,251, which is a continuation of application No. 12/179,769, filed on Jul. 25, 2008, now Pat. No. 7,952,366.

(60) Provisional application No. 60/952,053, filed on Jul. 26, 2007.

(51) Int. Cl.
*G01R 27/26* (2006.01)
*G08B 13/08* (2006.01)
*G06F 1/32* (2006.01)
(Continued)

(52) U.S. Cl.
CPC .............. *G06F 1/3231* (2013.01); *G01R 27/26* (2013.01); *G06F 1/3203* (2013.01); *G06F 1/3262* (2013.01); *G06F 3/044* (2013.01); *G06F 3/0416* (2013.01); *G08B 13/08* (2013.01); *H03K 17/955* (2013.01); *H03K 17/962* (2013.01);

(Continued)

(58) Field of Classification Search
CPC ..... G06F 3/044; G06F 1/3203; G06F 1/3262; H03K 17/955; H03K 17/962; H03K 2217/960705; H03K 2217/960725
USPC ......... 324/663, 658, 649, 600, 688, 686, 679, 324/671, 669, 662, 661, 660; 702/57; 340/545.4, 545.2, 545.1, 541, 540; 381/74; 345/174, 173
See application file for complete search history.

(56) References Cited

U.S. PATENT DOCUMENTS 5,730,165 A   3/1998   Philipp
6,452,494 B1  9/2002   Harrison
(Continued)

FOREIGN PATENT DOCUMENTS

EP   1536314 A2    6/2005
GB   2431725 A1    5/2007
WO   WO 2012/129247  9/2012

OTHER PUBLICATIONS

U.S. Appl. No. 61/454,936, filed Mar. 21, 2011, Myers.
(Continued)

*Primary Examiner* — Hoai-An D Nguyen
(74) *Attorney, Agent, or Firm* — Fish & Richardson P.C.

(57) ABSTRACT

In one embodiment, a method includes monitoring detection by a sensing element of a key touch on a touch screen; determining an amount of time that has elapsed since the sensing element last detected a change of capacitance indicative of a key touch on the touch screen; and, if the amount of time that has elapsed exceeds a predetermined time duration, then initiating a particular function of an apparatus.

20 Claims, 13 Drawing Sheets

(51) Int. Cl.
*G06F 3/044* (2006.01)
*H03K 17/955* (2006.01)
*H03K 17/96* (2006.01)
*G06F 3/041* (2006.01)

(52) U.S. Cl.
CPC ............. *H03K2217/960705* (2013.01); *H03K 2217/960725* (2013.01)

(56) References Cited

U.S. PATENT DOCUMENTS

| | | |
|---|---|---|
| 6,452,514 B1 | 9/2002 | Philipp |
| 6,466,036 B1 | 10/2002 | Philipp |
| 7,091,727 B2 | 8/2006 | Lee |
| 7,245,131 B2 | 7/2007 | Kurachi et al. |
| 7,567,088 B2 | 7/2009 | Yoshida |
| 7,663,607 B2 | 2/2010 | Hotelling |
| 7,714,595 B2 | 5/2010 | Fujiwara |
| 7,797,115 B2 | 9/2010 | Tasher |
| 7,864,503 B2 | 1/2011 | Chang |
| 7,875,814 B2 | 1/2011 | Chen |
| 7,920,129 B2 | 4/2011 | Hotelling |
| 7,952,366 B2 | 5/2011 | Philipp |
| 8,031,094 B2 | 10/2011 | Hotelling |
| 8,031,174 B2 | 10/2011 | Hamblin |
| 8,040,326 B2 | 10/2011 | Hotelling |
| 8,049,732 B2 | 11/2011 | Hotelling |
| 8,179,381 B2 | 5/2012 | Frey |
| 8,217,902 B2 | 7/2012 | Chang |
| 8,723,824 B2 | 5/2014 | Myers |
| 8,742,927 B2 * | 6/2014 | Olivier .......................... 340/541 |
| 8,749,251 B2 | 6/2014 | Philipp |
| 8,830,659 B2 * | 9/2014 | Castandet ................ 361/679.01 |
| 2003/0132763 A1 | 7/2003 | Ellenz |
| 2006/0170411 A1 | 8/2006 | Kurachi et al. |
| 2006/0250142 A1 | 11/2006 | Abe |
| 2007/0062739 A1 | 3/2007 | Philipp |
| 2007/0076897 A1 | 4/2007 | Philipp |
| 2008/0047764 A1 | 2/2008 | Lee et al. |
| 2008/0147350 A1 | 6/2008 | Jean |
| 2008/0246723 A1 | 10/2008 | Baumbach |
| 2008/0309635 A1 | 12/2008 | Matsuo |
| 2009/0027068 A1 | 1/2009 | Philipp |
| 2009/0225044 A1 | 9/2009 | Jeon et al. |
| 2009/0315854 A1 | 12/2009 | Matsuo |
| 2011/0242051 A1 | 10/2011 | Philipp |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0076612 A1 | 3/2013 | Myers |

OTHER PUBLICATIONS

U.S. Appl. No. 61/454,950, filed Mar. 21, 2011, Lynch.
U.S. Appl. No. 61/454,894, filed Mar. 21, 2011, Rothkopf.
UK Intellectual Property Office, Search Report for GB 0813682.2, Nov. 4, 2008.
Datasheet "QT100-Charge Transfer IC," Quantum Research Group, 2006.
Datasheet "QT100-Touch Sensor IC," Quantum Research Group, 2004.
H. Philipp, U.S. Appl. No. 12/179,769, Non-final rejection, Oct. 4, 2010.
H. Philipp, U.S. Appl. No. 12/179,769, Response to Non-final rejection, Jan. 4, 2011.
H. Philipp, U.S. Appl. No. 12/179,769, Notice of Allowance, Jan. 25, 2011.
H. Philipp, U.S. Appl. No. 12/179,769, Issue Notification, May 11, 2011.
H. Philipp, U.S. Appl. No. 13/116,764, Preliminary Amendment, Jun. 1, 2011.
H. Philipp, U.S. Appl. No. 13/116,764, Notice to File Corrected Application Papers, Jun. 10, 2011.
H. Philipp, U.S. Appl. No. 13/116,764, Applicant Response to Pre-Exam Formalities Notice, Jun. 16, 2011.
H. Philipp, U.S. Appl. No. 13/116,764, Notice of Allowance, Jan. 31, 2014.
H. Philipp, U.S. Appl. No. 13/116,764, Issue Notification, May 21, 2014.

* cited by examiner

P - override (reload auto off delay)
O - switch output off ($t_{off}$ burst time + 50ms)
C - sensor recalibration

PROXIMITY SENSOR

RELATED APPLICATIONS

This application is a continuation under 35 U.S.C. §120 of U.S. Patent Application Ser. No. 13/116,764, filed 26 May 2011, which is a continuation under 35 U.S.C. §120 of U.S. Patent Application Ser. No. 12/179,769, filed Jul. 25, 2008, which claims the benefit under 35 U.S.C. §119(e) of U.S. Provisional Patent Application No. 60/952,053, filed Jul. 26, 2007.

TECHNICAL FIELD

This disclosure generally relates to proximity sensors.

BACKGROUND

Capacitive position sensors have recently become increasingly common and accepted in human interfaces and for machine control. For example, in the fields of portable media players it is now quite common to find capacitive touch controls operable through glass or plastic panels. Some mobile telephones are also starting to implement these kinds of interfaces.

Many capacitive touch controls incorporated into consumer electronic devices for appliances provide audio or visual feedback to a user indicating whether a finger or other pointing object is present or approaches such touch controls. A capacitive sensing microprocessor may typically be comprised in touch-controlled devices which are arranged to provide an "on" output signal when a finger is adjacent to a sensor and an "off" output signal when a finger is not adjacent to a sensor. The signals are sent to a device controller to implement a required function dependent on whether a user's finger is in proximity with or touching an associated touch control.

Some touch-controlled devices remain "on" or "active" despite the user having moved away from the device or a particular function no longer being required. This results in the device consuming a large amount of power which is not efficient.

OVERVIEW

Particular embodiments provide a sensor for determining the presence of an object comprising: a sensing element; a capacitance measurement circuit operable to measure the capacitance of the sensing element; and a control circuit operable to determine whether an object is in proximity with the sensor based on a measurement of the capacitance of the sensing element, the control circuit further being operable to provide an output signal to control a function of an apparatus when it is determined that an object has not been in proximity with the sensor for a predetermined time duration.

The control circuit may be configured so that the predetermined time duration is selectable from a number of different predefined time durations.

The control circuit may include a time input terminal and the predetermined time duration may selectable from the number of different predefined time durations according to a voltage applied to the time input terminal.

The control circuit may include a delay multiplier terminal and be configured so that a selected one of the number of different predefined time durations is multiplied by a multiplication factor according to a voltage applied to the delay multiplier terminal so as to provide the predetermined time duration.

The control circuit may be configured so that the predetermined time duration is programmable by a user to provide a user-selected time duration.

The sensor may comprise a resistor-capacitor (RC) network coupled to the control circuit and the predetermined time duration may depend on a time constant of the RC network.

The control circuit may include a delay multiplier terminal and be configured so that the user-selected time duration is multiplied by a multiplication factor according to a voltage applied to the delay multiplier terminal to provide the predetermined time duration.

The control circuit may be configured such that the provision of the output signal to control a function of an apparatus after the predetermined time duration may be overridden so the output signal is not provided when it is determined that an object has not been in proximity with the sensor for a predetermined time duration. For example, the control circuit may be operable to receive an override pulse and on receipt of the override pulse to retrigger the predetermined time duration to so as to extend the time before the output signal to control a function of an apparatus is provided.

The control circuit may be configured such that the provision of the output signal to control a function of an apparatus after the predetermined time duration may be overridden so the output signal is provided before it is determined that an object has not been in proximity with the sensor for a predetermined time duration. For example, the control circuit may be operable to receive an override pulse and on receipt of the override pulse to provide the output signal to control a function of an apparatus.

The sensor may be configured to perform a recalibration when the sensor is powered up, when an object is determined to be in proximity with the sensor for more than a timer setting, and/or when an override is released.

The control circuit may be configured such that the output signal is toggled between a high state and a low state when an object is determined to be in proximity with the sensor.

The function of an apparatus controlled by the output signal may be a switch-off function.

The capacitance measurement circuit may employ bursts of charge-transfer cycles to acquire measurements.

The capacitance measurement circuit may be configured to operate in one of more than one acquisition modes depending on the output signal, for example a low-power mode or a fast mode.

The capacitance measurement circuit and the control circuit may be comprised in a general purpose microcontroller under firmware control.

The capacitance measurement circuit and the control circuit may be comprised within a six-pin integrated circuit chip package, such as an SOT23-6.

Particular embodiments provide an apparatus including a sensor as described above.

Particular embodiments provide a method for controlling a function of an apparatus comprising: determining whether an object is in proximity with a sensor based on a measurement of the capacitance of a sensing element and providing an output signal to control the function of the apparatus when it is determined that an object has not been in proximity with the sensor for a predetermined time duration.

The function of the apparatus controlled by the output signal may be a switch-off function.

Particular embodiments provide a sensor for determining the presence of an object comprising: a sensing element, a capacitance measurement circuit operable to measure the capacitance of the sensing element, and a control circuit operable to determine whether an object is in proximity with the sensor based on a measurement of the capacitance of the sensing element, the control circuit also being operable to provide an output signal to control a function of an apparatus based on an object not being in proximity with the sensor and the output signal being produced after a predetermined time duration.

BRIEF DESCRIPTION OF THE DRAWINGS

Reference is now made by way of example to the accompanying drawings in which.

DESCRIPTION OF EXAMPLE EMBODIMENTS

Figure 1:
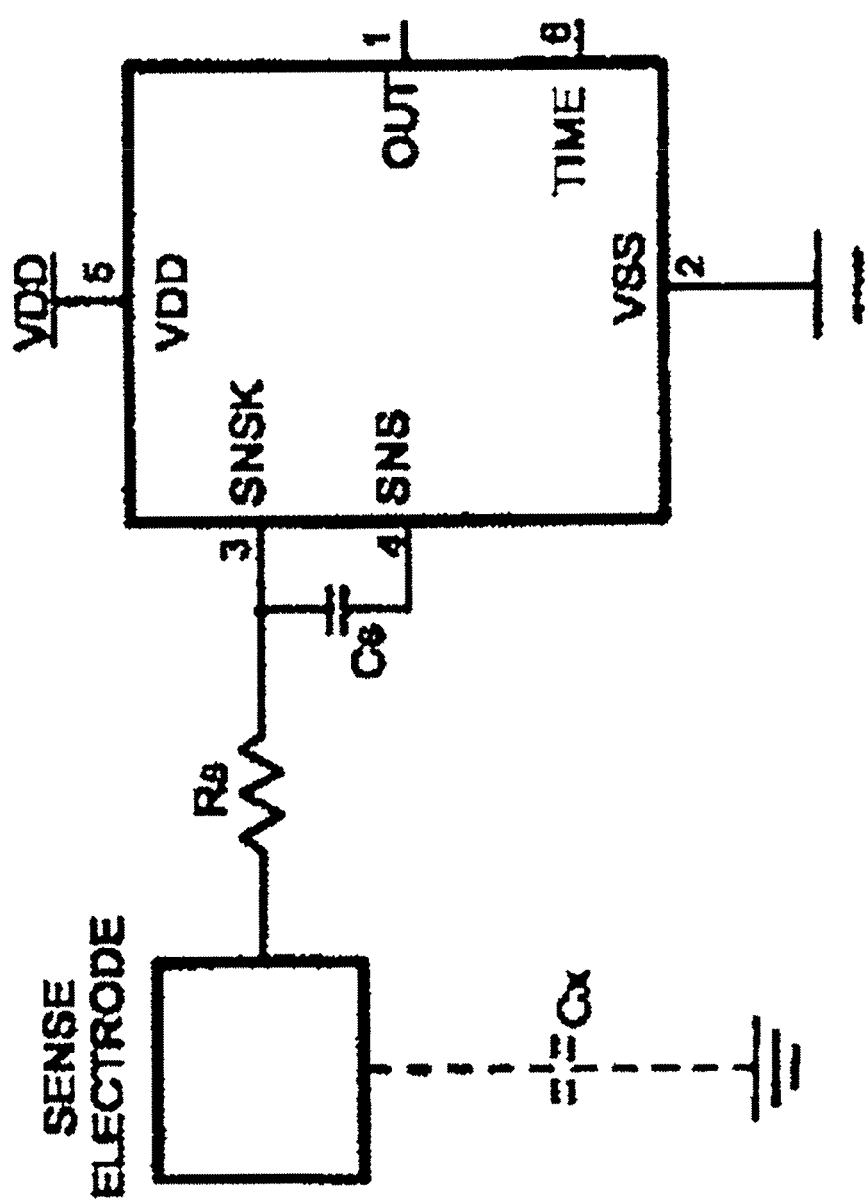
FIG. 1 schematically shows sense electrode connections for an example chip for implementing an auto-off function in particular embodiments.

Particular embodiments may be implemented in an integrated circuit chip providing a proximity sensor function. The integrated circuit chip may thus be incorporated into a device or apparatus to provide and control a proximity sensor functionality for the device or apparatus in particular embodiments. For the purposes of explanation, a specific integrated circuit chip providing the functionality of an example embodiment will be described further below. The chip will in places be referred to by product name QT102. However, it will be appreciated that the QT102 chip is merely a specific example application of an example embodiment. Particular embodiments need not be implemented in a chip in this way, and furthermore, particular embodiments may be provided in conjunction with all, some or none of the additional features of the QT102 chip described further below.

Before turning specifically to the QT102 chip embodiment, a summary is provided.

It is known that a touch sensitive sensor may comprise a sensor element, such as an etched copper electrode mounted on a PCB substrate, and a control circuit for measuring a capacitance of the sensor element to a system reference potential. The sensor element may be referred to as a sense electrode. The capacitance of the sense electrode is affected by the presence of nearby objects, such as a pointing finger. Thus the measured capacitance of the sense electrode, and in particular changes in the measured capacitance, may be used to identify the presence of an object adjacent the sense electrode. The control circuit may be configured to provide an output signal, e.g. by setting an output logic level as high or low, indicating whether or not an object is deemed to be adjacent the sense electrode. A controller of a device in which the touch sensitive sensor is implemented may receive the output signal and act accordingly.

There are various known technologies for measuring capacitance of a sense electrode in a capacitive touch sensor. Particular embodiments may be implemented in conjunction with any of these technologies or measurement circuits. For example, the fundamental principles underlying the capacitive sensors described in U.S. Pat. No. 5,730,165, U.S. Pat. No. 6,466,036, and U.S. Pat. No. 6,452,514 could be used.

In particular embodiments, the control circuit of the sensor can determine whether an object or a user's finger is no longer in proximity with the sensor and based on a predetermined time duration, the control circuit can produce an output signal automatically to prevent the capacitance measurement circuit from continually measuring changes in capacitance due to, for example, the perceived presence of an object in proximity with the sensor.

Therefore, the control circuit is able to deactivate, turn-off, or power down the capacitance measurement circuit where an apparatus has inadvertently been left on or with the erroneous perception that a user is still present. This may, for example, be referred to as an "auto-off" feature. The signal for preventing the capacitance measurement circuit from continually measuring changes in capacitance may be referred to as an auto-off signal. The capacitance measurement circuit and the auto-off control circuit may be comprised in a general-purpose microcontroller under firmware control, for example, such as the QT102 chip described further below.

As described in Section 3.5 of the below numbered sections, and in conjunction with the drawings, the control circuit of the sensor may be implemented by different methods—for example, the auto-off signal output may be produced automatically after different predetermined time durations to effect powering down the capacitance measurement circuit due to no presence of the user; the control circuit may be programmed by a user so that it may power down an apparatus based on a user-selected time duration; the control circuit output signals may be overridden, for example, to extend time durations before an apparatus is turned-off or to immediately turn-off an apparatus when a user is no longer present.

The sensor of particular embodiments may be useful in various applications, for example in kitchen appliances, light switches, headsets, and other electronic consumer devices. For example, a coffee machine incorporating a sensor of particular embodiments may be programmed to power-down after a time period of, say, 30 minutes, where the coffee machine has been left on inadvertently. This will beneficially conserve energy use and minimize the possibility of damage or accidents caused by the coffee machine or glass container(s) overheating.

Aspects of the QT102 chip referred to above will now be described in the following numbered sections.

The numbered sections may be considered to relate generally to features of the QT102 chip as follows: Section 1—Overview (including 1.1 Introduction, 1.2 Electrode Drive, 1.3 Sensitivity, 1.3.1 Introduction, 1.3.2 Increasing Sensitivity, 1.3.3 Decreasing Sensitivity, 1.4 Recalibration Timeout, 1.5 Forced Sensor Recalibration, 1.6 Drift Compensation, 1.7 Response Time, 1.8 Spread. Spectrum). Section 2—Wiring and Parts (including 2.1 Application Note, 2.2 Cs Sample Capacitor, 2.3 Rs Resistor, 2.4 Power Supply, PCB Layout, 2.5 Wiring). Section 3—Operation (including 3.1 Acquisition Modes, 3.1.1 Introduction, 3.1.2 OUT Pin "On" (Fast Mode), 3.1.3 OUT Pin "Off" (Low Power Mode), 3.2 Signal Processing, 3.2.1 Detect Integrator, 3.2.2 Detect Threshold, 3.3 Output Polarity Selection, 3.4 Output Drive, 3.5 Auto Off Delay, 3.5.1 Introduction, 3.5.2 Auto Off—Predefined Delay, 3.5.3 Auto Off—User-programmed Delay, 3.5.4 Auto Off—Overriding the Auto Off Delay, 3.5.5 Configuring the User-programmed Auto-off Delay, 3.6 Examples of Typical Applications). Section 4—Specifications (including 4.1 Absolute Maximum Specifications, 4.2 Recommended Operating Conditions, 4.3 AC Specifications, 4.4 Signal Processing, 4.5 DC Specifications, 4.6 Mechanical Dimensions, 4.7 Moisture Sensitivity Level (MSL)).

1 Overview 1.1 Introduction

The QT102 is a single key device featuring a touch on/touch off (toggle) output with a programmable auto switch-off capability.

The QT102 is a digital burst mode charge-transfer (QT) sensor designed specifically for touch controls; it includes hardware and signal processing functions to provide stable sensing under a wide variety of changing conditions. In examples, low cost, non-critical components are employed for configuring operation.

The QT102 employs bursts of charge-transfer cycles to acquire its signal. Burst mode permits power consumption in the microampere range, dramatically reduces radio frequency (RE) emissions, lowers susceptibility to electromagnetic interference (EMI), and yet permits good response time.

Internally the signals are digitally processed to reject impulse noise, using a "consensus" filter which in this example requires four consecutive confirmations of a detection before the output is activated.

The QT switches and charge measurement hardware functions are all internal to the QT102.

1.2 Electrode Drive

FIG. 1 schematically shows the sense electrode connections (SNS, SNSK) for the QT102.

For improved noise immunity, it may be helpful if the electrode is only connected to the SNSK pin.

In examples the sample capacitor Cs may be much larger than the load capacitance (Cx). E.g. typical values for Cx are 5 to 20 pF while Cs is usually 1 or 2 to 50 nF. (Note: Cx is not a physical discrete component on the PCB, it is the capacitance of the touch electrode and wiring. It is shown in FIG. 1 to aid understanding of the equivalent circuit.)

Increasing amounts of Cx destroy gain, therefore it is important to limit the amount of load capacitance on both SNS terminals. This can be done, for example, by minimizing trace lengths and widths and keeping these traces away from power or ground traces or copper pours.

The traces and any components associated with SNS and SNSK will become touch sensitive and so may need to be considered to help in limiting the touch-sensitive area to the desired location.

A series resistor, Rs, may be placed in line with SNSK to the electrode to suppress electrostatic discharge (ESD) and Electromagnetic Compatibility (EMC) effects.

1.3 Sensitivity 1.3.1 Introduction

The sensitivity of the QT102 is a function of such things as:
the value of Cs
electrode size and capacitance
electrode shape and orientation
the composition and aspect of the object to be sensed
the thickness and composition of any overlaying panel material
the degree of ground coupling of both sensor and object 1.3.2 Increasing Sensitivity In some cases it may be desirable to increase sensitivity; for example, when using the sensor with very thick panels having a low dielectric constant. Sensitivity can often be increased by using a larger electrode or reducing panel thickness. Increasing electrode size can have diminishing returns, as high values of Cx will reduce sensor gain.

The value of Cs also has an effect on sensitivity, and this can be increased in value with the trade-off of slower response time and more power. Increasing the electrode's surface area will not substantially increase touch sensitivity if its diameter is already significantly larger in surface area than the object being detected. Panel material can also be changed to one having a higher dielectric constant, which will better help to propagate the field.

Ground planes around and under the electrode and its SNSK trace may lead to high Cx loading and destroy gain. Thus in some cases the possible signal-to-noise ratio benefits of ground areas may be more than negated by the decreased gain from the circuit, and so ground areas around electrodes may be discouraged in some circumstances. Metal areas near the electrode may reduce the field strength and increase Cx loading and so it may be helpful if these are avoided if possible. It may be helpful to keep ground away from the electrodes and traces.

1.4 Recalibration Timeout

If an object or material obstructs the sense electrode the signal may rise enough to create a detection, preventing further operation. To help reduce the risk of this, the sensor includes a timer which monitors detections. If a detection exceeds the timer setting (known as the Max On-duration) the sensor performs a full recalibration. This does not toggle the output state but ensures that the QT102 will detect a new touch correctly. The timer is set to activate this feature after ~30 seconds. This will vary slightly with Cs.

1.5 Forced Sensor Recalibration

The QT102 has no recalibration pin; a forced recalibration is accomplished when the device is powered up, after the recalibration timeout or when the auto-off override is released.

However, supply drain is low so it is a simple matter to treat the entire IC as a controllable load; driving the QT102's VDD pin directly from another logic gate or a microcontroller port will serve as both power and "forced recal(ibration)". The source resistance of most CMOS gates and microcontrollers are low enough to provide direct power without problems.

1.6 Drift Compensation

Signal drift can occur because of changes in Cx and Cs over time. It may be helpful if drift is compensated for, otherwise false detections, nondetections, and sensitivity shifts may follow.

Figure 2:
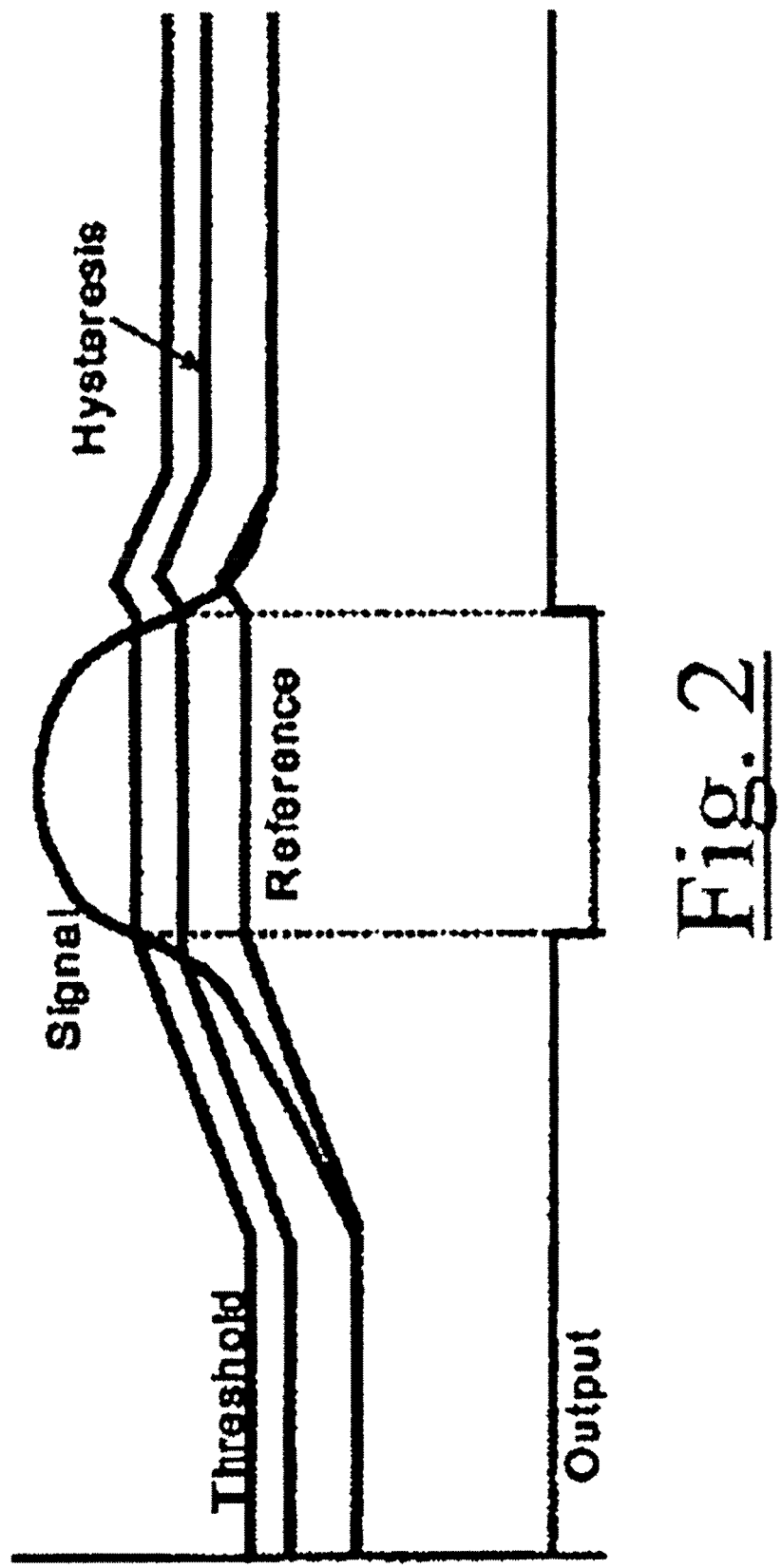
FIG. 2 schematically represent an application of drift compensation in the chip of FIG. 1.

Drift compensation is schematically shown in FIG. 2. Drift compensation is performed by making a reference level track the raw signal at a slow rate, but only while there is no detection in effect. It may be helpful if the rate of adjustment is performed relatively slowly, otherwise there may be a risk that legitimate detections may be ignored. The QT102 drift compensates using a slew-rate limited change to the reference level; the threshold and hysteresis values are slaved to this reference.

Once an object is sensed, the drift compensation mechanism ceases since the signal is legitimately high, and therefore should not cause the reference level to change (as indicated in FIG. 2 during the period between the vertical dotted lines).

The QT102's drift compensation is "asymmetric"; the reference level drift-compensates in one direction faster than it does in the other. Specifically, it compensates faster for decreasing signals than for increasing signals. It may be helpful if increasing signals are not compensated for quickly, since an approaching finger could be compensated for partially or entirely before approaching the sense electrode.

However, an obstruction over the sense pad, for which the sensor has already made full allowance, could suddenly be removed leaving the sensor with an artificially elevated reference level and thus become insensitive to touch. In this latter case, the sensor will compensate for the object's removal more quickly, for example in only a few seconds.

With relatively large values of Cs and small values of Cx, drift compensation will appear to operate more slowly than with the converse. Note that the positive and negative drift compensation rates are different.

1.7 Response Time

The QT102's response time is dependent on burst length, which in turn is dependent on Cs and Cx. With increasing Cs, response time slows, while increasing levels of Cx reduce response time.

1.8 Spread Spectrum

The QT102 modulates its internal oscillator by ±7.5 percent during the measurement burst. This spreads the generated noise over a wider band reducing emission levels. This also reduces susceptibility since there is no longer a single fundamental burst frequency.

2. Wiring and Parts

Figure 3:
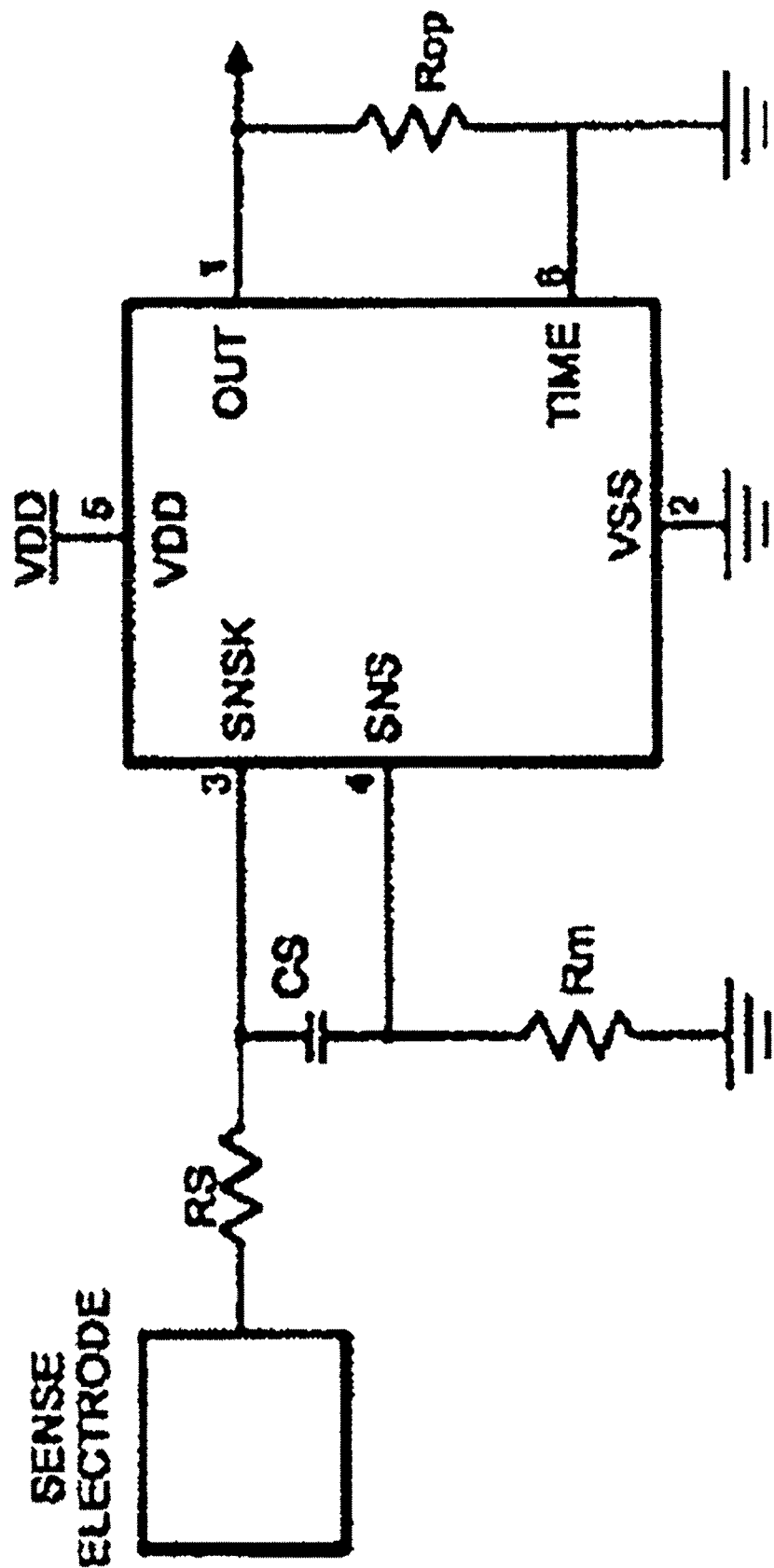
FIG. 3 schematically shows a basic circuit configuration for providing a 15 minute auto switch-off function in an active high output implementation of particular embodiments.

FIG. 3 schematically shows a basic circuit configuration for an implementation of particular embodiments.

2.1 Application Note

Although not necessarily relevant to particular embodiments, for completeness, reference may be made to Application Note AN-KD02 ("Secrets of a Successful QTouch™ Design"), included herein in its entirety by reference, and downloadable from the Quantum Research Group website, for information on example construction and design methods. Go to http://www.qprox.com, click the Support tab and then Application Notes.

2.2 Cs Sample Capacitor

Cs is the charge sensing sample capacitor. The required Cs value depends on the thickness of the panel and its dielectric constant. Thicker panels require larger values of Cs. Typical values are 1 or 2 nF to 50 nF depending on the sensitivity required; larger values of Cs may demand higher stability and better dielectric to ensure reliable sensing.

The Cs capacitor may be a stable type, such as X7R ceramic or PPS film. For more consistent sensing from unit to unit, 5 percent tolerance capacitors are recommended. X7R ceramic types can be obtained in 5 percent tolerance for little or no extra cost. In applications where high sensitivity (long burst length) is required, the use of PPS capacitors is recommended.

Series resistor Rs is in line with the electrode connection and may be used to limit electrostatic discharge (ESD) currents and to suppress radio frequency interference (RFI). It may be approximately 4.7 k$\Omega$ to 33 k$\Omega$, for example.

Although this resistor may be omitted, the device may become susceptible to external noise or RF 1. For more details of how to select these resistors see the Application Note AN-KD02 referred to above in Section 2.1.

2.4 Power Supply, PCB Layout

The power supply (between VDD and VSS/system ground) can range between 2.0V and 5.5V for the QT102 implementation. If the power supply is shared with another electronic system, it may be helpful if care is taken to ensure that the supply is free of digital spikes, sags, and surges which can adversely affect the device. The QT102 will track slow changes in VDD, but it may be more affected by rapid voltage fluctuations. Thus it may be helpful if a separate voltage regulator is used just for the QT102 to isolate it from power supply shifts caused by other components.

If desired, the supply can be regulated using a Low Dropout (LDO) regulator. See Application Note AN-KD02 (see Section 2.1) for further information on power supply considerations.

Suggested regulator manufacturers include:

Toko (XC6215 series)

Seiko (S817 series)

BCDSemi (AP2121 series)

Parts placement: The chip may be placed to minimize the SNSK trace length to reduce low frequency pickup, and to reduce Cx which degrades gain. It may be helpful if the Cs and Rs resistors (see FIG. 3) are placed close to the body of the chip so that the trace between Rs and the SNSK pin is relatively short, thereby reducing the antenna-like ability of this trace to pick up high frequency signals and feed them directly into the chip. A ground plane can be used under the chip and the associated discretes, but it may be helpful if the trace from the Rs resistor and the electrode do not run near ground, to reduce loading.

For improved Electromagnetic compatibility (EMC) performance the circuit may be made entirely with surface mount technology (SMT) components.

Electrode trace routing: It may be helpful to keep the electrode trace (and the electrode itself) away from other signal, power, and ground traces including over or next to ground planes. Adjacent switching signals can induce noise onto the sensing signal; any adjacent trace or ground plane next to, or under, the electrode trace will cause an increase in Cx load and desensitize the device.

Note: a 100 nF (0.1 µF) ceramic bypass capacitor (not shown in FIG. 3) might be used between VDD and VSS in cases where it is considered appropriate to help avoid latch-up if there are substantial VDD transients; for example, during an ESD (electrostatic discharge) event. It may furthermore be helpful if the bypass capacitor is placed close to the device's power pins.

TABLE 2.1

QT102 Pin Descriptions
(referring to the pin numbering shown in FIG. 3)

| PIN | NAME | TYPE | DESCRIPTION |
|-----|------|------|-------------|
| 1 | OUT | O | To switched circuit and output polarity selection resistor (Rop) |
| 2 | VSS | P | Ground power pin |
| 3 | SNSK | IO | To Cs capacitor and to sense electrode |
| 4 | SNS | IO | To Cs capacitor and multiplier configuration resistor (Rm). Rm connected to either VSS or VDD. Refer to Section 3.5 for details. |
| 5 | VDD | P | Positive power pin |
| 6 | TIME | I | Timeout configuration pin, connected to either VSS, VDD, OUT or an RC network. Refer to Section 3.5 for details. |

Type:
P—Ground or power;
IO—Input and output;
OD—Open drain output;
O—Output only, push-pull;
I—Input only Regarding FIG. 3, the following sections provide guidance for some example component values: Section 2.2 for Cs capacitor (Cs); Section 2.3 for Sample resistor (Rs); Section 2.4 for Voltage levels; Section 3.5.2 for Rm; and Section 3.3 for Rop.

3. Operation
3.1 Acquisition Modes
3.1.1 Introduction

The polarity for the OUT pin of the QT102 can be configured to be "active high" or "active low" (see Section 3.3). If configured active high, then "on" is high and "off" is low. If configured active low, then "on" is low and "off" is high.

The QT102 has more than one acquisition mode with the mode depending on the state of the OUT pin (on or off) and whether a touch is detected. In the following text "on" is when the output is in its active state (which could be high or low depending on how the polarity for the OUT pin is configured).

3.1.2 OUT Pin "On" (Fast Mode)

Figure 4:
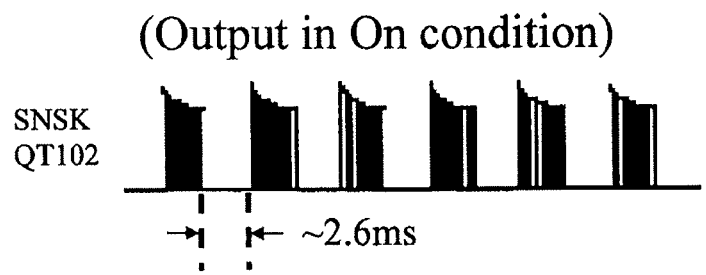
FIG. 4 schematically shows a series of fast mode bursts on the SNSK pin of the chip shown in FIG. 1 where in an on condition.

The QT102 runs in a "Fast mode" when the OUT pin is on. In this mode the device runs at maximum speed at the expense of increased current consumption. The delay between bursts in Fast mode is approximately 2.6 ms. FIG. 4 schematically shows bursts on the SNSK pin during fast mode acquisition.

3.1.3 OUT Pin "Off" (Low Power Mode)

Figure 5:
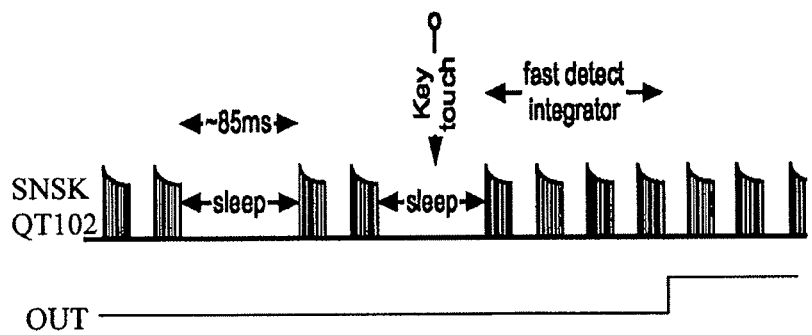
FIG. 5 schematically shows a series of low-power mode bursts and a switch to fast mode power bursts on the SNSK pin of the chip shown in FIG. 1 when switching from an off condition to an on condition.

The QT102 runs in Low Power (LP) mode if the OUT pin is off. In this mode it sleeps for approximately 85 ms at the end of each burst, saving power but slowing response. On detecting a possible key touch, it temporarily switches to Fast mode until either the key touch is confirmed or found to be spurious (via the detect integration process). If the touch is confirmed the QT102 will switch to Fast mode. If a touch is denied the device will revert to normal LP mode operation automatically. FIG. 5 schematically shows bursts on the SNSK pin during a touch detection event. Also schematically represented is the output signal on the OUT pin. A key touch occurs around halfway along the figure. Prior to the key touch, the OUT pin is off (schematically shown here as a low logic level) and the QT102 is running in Low Power mode with sleep periods between bursts. The capacitance measured during the first burst after the key touch is higher and this triggers Fast mode acquisition. Following four burst in which the higher capacitance is seen (see Section 3.2.1), the OUT pin switches to on (schematically shown here as a high logic level) and Fast mode acquisition continues.

3.2 Signal Processing
3.2.1 Detect Integrator

It is desirable to suppress detections generated by electrical noise or from quick brushes with an object. To accomplish this, the QT102 incorporates a "detect integration" (DI) counter that increments with each detection until a limit is reached, after which the output is activated. If no detection is sensed prior to the final count, the counter is reset immediately to zero. In the QT102, the required count is four. The DI can also be viewed as a "consensus" filter, that requires four successive detections to create an output.

3.2.2 Detect Threshold

The device detects a touch when the signal has crossed a threshold level, in this example the threshold level is fixed at 10 counts.

3.3 Output Polarity Selection

Figure 6:
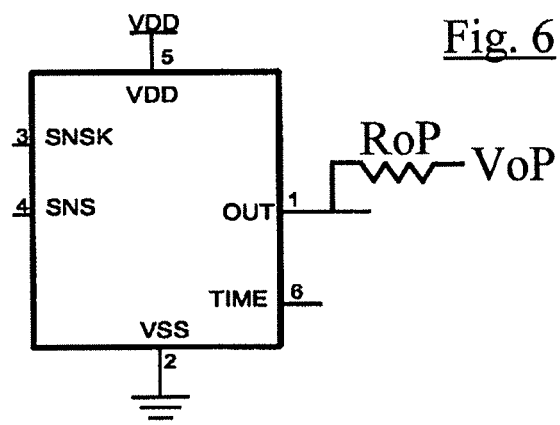
FIG. 6 schematically shows use of an output configuration resistor Rop to configure the chip of FIG. 1 to have an active high or an active low output.
Figure 7:
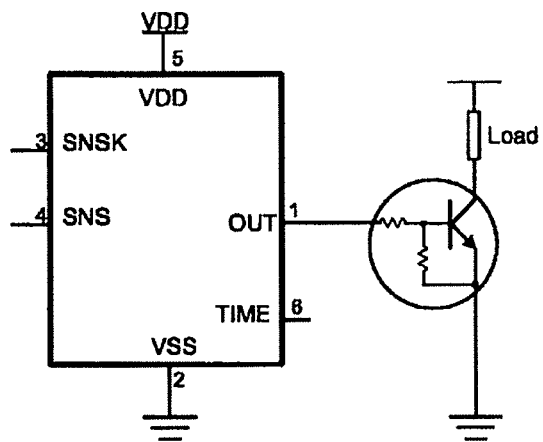
FIG. 7 schematically shows an example circuit configuration for the chip shown in FIG. 1 with the output connected to a digital transistor.

The output (OUT pin) of the QT102 can be configured to have an active high or active low output by means of the output configuration resistor Rop. The resistor is connected between the output an output configuration voltage Vop, which may be either VSS or VDD as schematically shown in FIG. 6. For the QT102, if Vop is VSS, the output polarity is configured active high. If Vop is VDD, the output polarity is configured active low It is noted that some devices, such as Digital Transistors, have an internal biasing network that will naturally pull the OUT pin to its inactive state. If these are being used then the resistor Rop is not required, as schematically shown in FIG. 7.

3.4 Output Drive

The OUT pin in the QT102 embodiment can sink or source up to 2 mA. When a relatively large value of Cs (e.g. >20 nF) is used, it may be helpful if the OUT pin current is limited to <1 mA to reduce the risk of gain-shifting side effects. These may happen when the load current creates voltage drops on the die and bonding wires; in some cases these small shifts can materially influence the signal level to cause detection instability.

3.5 Auto Off Delay
3.5.1 Introduction

In addition to toggling the output on/off with key touch, the QT102 can automatically switch the output off after a specific time. This feature can be used to save power in situations where the switched device could be left on inadvertently.

The QT102 has:
three predefined delay times (Section 3.5.2)
the ability to set a user-programmed delay (Section 3.5.3)
the ability to override the auto off delay (Section 3.5.4)

The QT102 chip is programmed such that the TIME and SNS pins may be used to configure the auto-off delay $t_o$ and may be connected in one of the ways described in Sections 3.5.2, 3.5.3 and 3.5.4 to provide different functionality.

3.5.2 Auto Off—Predefined Delay

Figure 8:
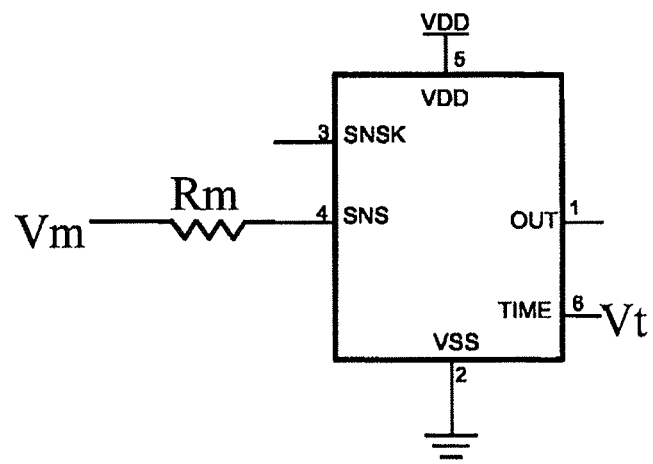
FIG. 8 schematically shows an example circuit configuration for the chip shown in FIG. 1 configured to provide a predefined auto-off delay.

To configure a predefined delay $t_o$ the TIME pin may be wired to a voltage $V_f$, as schematically indicated in FIG. 8.

Voltage $V_t$ may be VSS, VDD or OUT. These provides nominal values of $t_o$=15 minutes, 60 minutes or infinity (remains on until toggled off) as indicated in Table 3.2 for an active high output configuration and in Table 3.3 for an active low output configuration.

Furthermore, also as shown in FIG. 8, a resistor Rm (e.g. a 1 MΩ resistor) may be connected between the SNS pin and the logic level Vm to provide three auto off functions: namely delay multiplication, delay override and delay retriggering. On power-up the logic level at Vm is assessed and a delay multiplication factor is set to ×1 or ×24 accordingly (see Table 3.4). At the end of each acquisition cycle the logic level of Vm is monitored to see if an Auto off delay override is required (see Section 3.5.4).

Setting the delay multiplier to ×24 will decrease the key sensitivity. Thus in some cases it may be appropriate to compensate for this by increasing the value of Cs.

TABLE 3.2

Predefined Auto-off Delay
(Active High Output)

| Vt | Auto-off delay ($t_o$) |
|---|---|
| VSS | Infinity (remain on until toggled to off) |
| VDD | 15 minutes |
| OUT | 60 minutes |

TABLE 3.3

Predefined Auto-off Delay
(Active Low Output)

| Vt | Auto-off delay ($t_o$) |
|---|---|
| VSS | 15 minutes |
| VDD | Infinity (remain on until toggled to off) |
| OUT | 60 minutes |

TABLE 3.4

Auto-off Delay Multiplier

| Vm | Auto-off delay multiplier |
|---|---|
| VSS | $t_o * 1$ |
| VDD | $t_o * 24$ |

3.5.3 Auto Off—User-Programmed Delay

Figure 9:
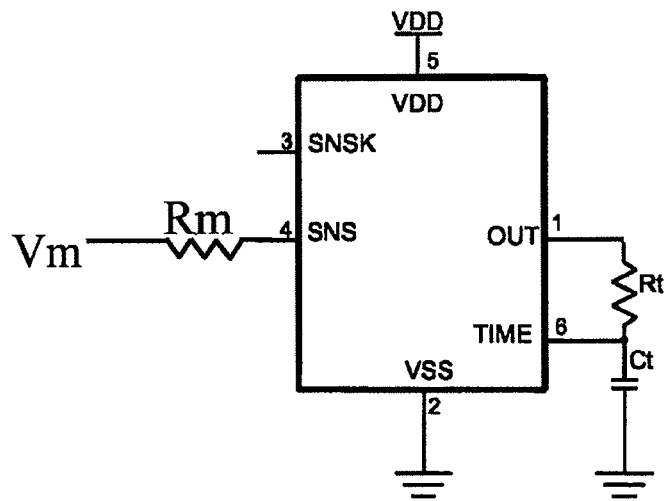
FIG. 9 schematically shows an example circuit configuration for the chip shown in FIG. 1 configured to provide a programmable auto-off delay.

If a user-programmed delay is desired, a resistor Rt and capacitor Ct can be used to set an auto-off delay (see Table 3.5 and FIG. 9). The delay time is dependent on the RC time constant (Rt*Ct) the output polarity (i.e. whether active high or active low), and the supply voltage. Section 3.5.5 gives more details of how to configure the QT102 to have auto-off delay times ranging from 1 minute to up to 24 hours.

TABLE 3.5

Programmable Auto Off Delay

| Output type | Auto Off Delay (seconds) |
|---|---|
| Active high | (Rt * Ct * 15)/42 |
| Active low | (Rt * Ct * 15)/14.3 |

Notes: The RC divisor values K(42 and 14.3) may be obtained from FIGS. 13 and 14. In this example the values are for a supply voltage VDD=3.5 volts. For the parameterization shown in Table 3.5, Rt is in kΩ and Ct is in nF.

3.5.4 Auto Off—Overriding the Auto Off Delay

Figure 10:
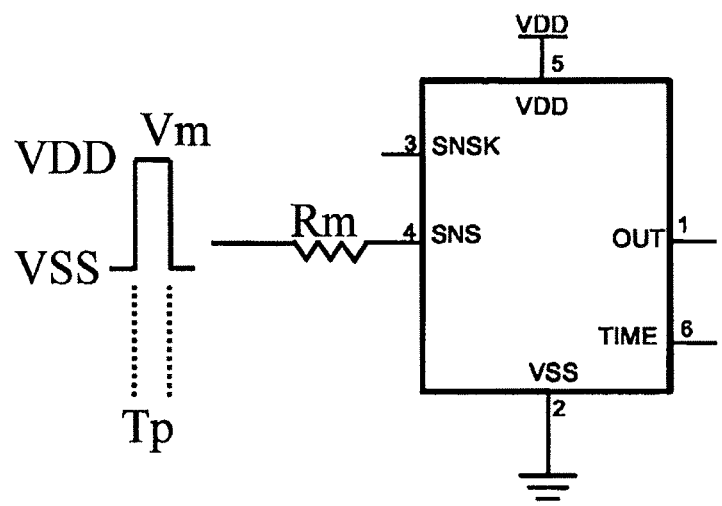
FIG. 10 schematically shows an example pulse applied to the chip shown in FIG. 1 to override an auto-off delay.
Figure 11:
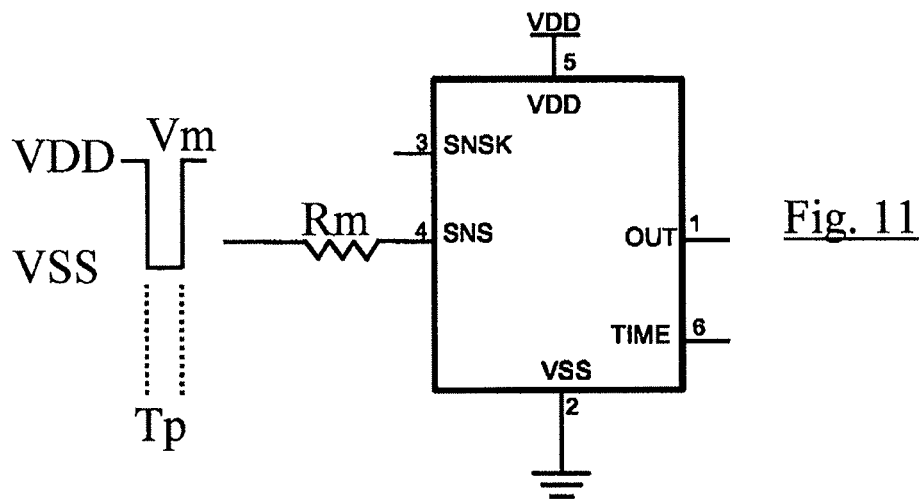
FIG. 11 schematically shows another example pulse applied to the chip shown in FIG. 1 to override an auto-off delay.

In normal operation the QT102 output is turned off automatically after the auto-off delay. However, in some applications it may be useful to extend the auto-off delay ("sustain" function), or to switch the output off immediately ("cancel" function). This can be achieved by pulsing the voltage on the delay multiplier resistor Rm as schematically shown in FIG. 10 (positive-going pulse from VSS to VDD for delay multiplier ×1 configuration) and FIG. 11 (negative-going pulse from VDD to VDD for delay multiplier ×24 configuration). The pulse duration tp may determine whether a retrigger of the auto-off delay or a switch of the output to off is desired. To help ensure the pulse is detected it may be present for a time greater than the burst length as shown in Table 3.6.

TABLE 3.6

Time Delay Pulse

| Pulse Duration | Action |
|---|---|
| tp > burst time + 10 ms (typical value 25 ms) | Retrigger (reload auto-off delay counter) |
| tp > burst time + 50 ms (typical value 65 ms) | Switch output to off state and inhibit further touch detection until Vm returns to original state |

While Vm is held in the override state (i.e. the duration of the pulse) the QT102 inhibits bursts and waits for Vm to return to its original state (at the end of the pulse). When Vm returns to its original state the QT102 performs a sensor recalibration before continuing in its current output state.

Figure 12:
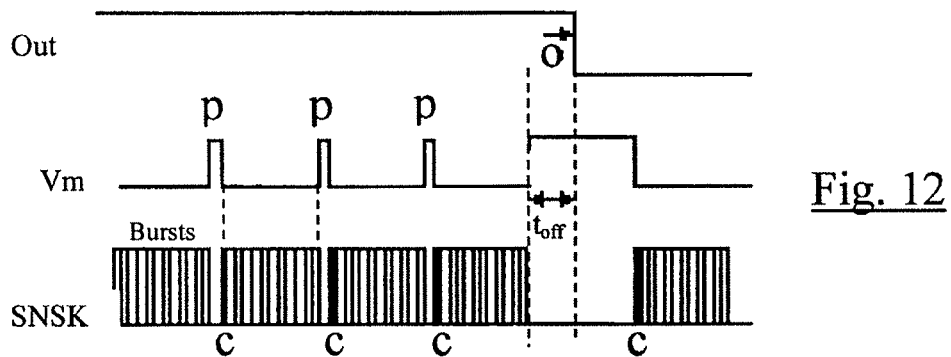
FIG. 12 schematically shows example voltage levels for the chip shown in FIG. 1 in overriding of an auto-off delay.

FIG. 12 schematically shows override pulses being applied to a QT102 with delay multiplier set to ×1 (i.e. Vm normally at VSS with positive going pulses). The QT102 OUT signal is shown at the top of FIG. 12. Vm is shown in the middle. Acquisition bursts on SNSK are shown at the bottom. Each short pulse P on Vm causes a sensor recalibration C and a restart of the auto-off timer. During the long pulse applied to Vm (i.e. where $tp>t_{off}$), the output is switched off at O. When the pulse finishes, the output remains switched off and a sensor recalibration C is performed.

3.5.5 Configuring the User-Programmed Auto-Off Delay

As described in Section 3.5.3 the QT102 can be configured to give auto-off delays ranging from minutes to hours by means of a simple CR network and the delay multiplier input.

With the delay multiplier set at ×1 the auto-off delay is calculated as follows:

Delay value=integer value of $(Rt*Ct/K)*15$ seconds.

(i.e. Rt*Ct=Delay value (in seconds)*K/15
Note: Rt is in kΩ, Ct is in nF.

In some applications improved operation may be achieved if the value of Rt*Ct is between 4 and 240. Values outside this range may be interpreted as the hard wired options TIME linked to OUT and TIME linked to "off" respectively, causing the QT102 to use the relevant predefined auto-off delays (see Tables 3.2 and 3.3).

Figure 13:
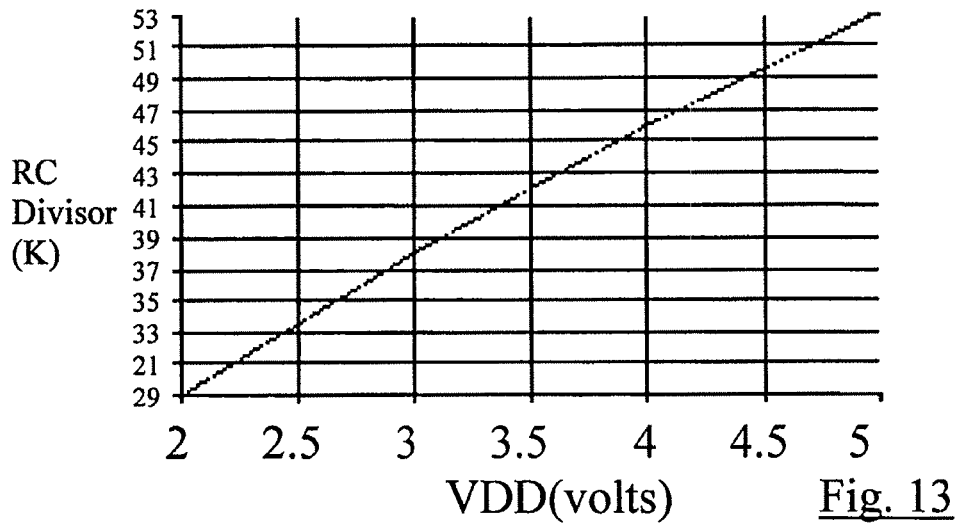
FIGS. 13 and 14 schematically show typical values of RC divisor K as
  a function of supply voltage VDD for the chip shown in
    FIG. 1 with active high output and active low output respectively.
Figure 14:
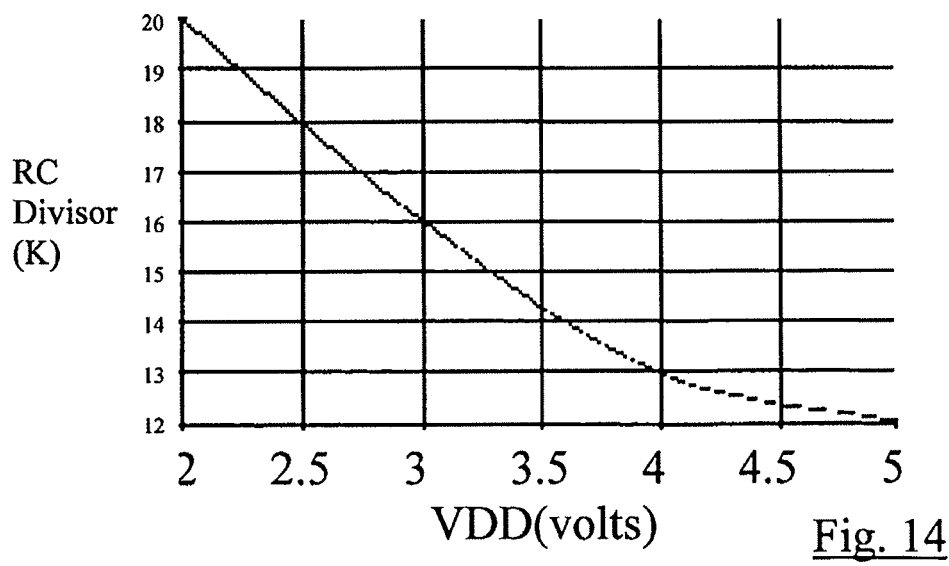

FIGS. 13 and 14 show typical values of K versus supply voltage for a QT102 with active high or active low output.

Example Using the Formula to Calculate Rt and Ct
Requirements/Operating Parameters:
Active high output (Vop connected to VSS)
Auto-off delay 45 minutes
VDD=3.5 v Proceed as Follows:
1. Calculate Auto-off delay in seconds 45*60=2700
2. Obtain K from FIG. 13 (active high): K=42 for VDD=3.5 v
3. Calculate Rt*Ct=2700*42/15=7560
4. Select a value for Ct (or conversely Rt). E.g. Ct=47 nF
5. Calculate Rt (or conversely Ct)=7560/47=160 kΩ

Figure 15:
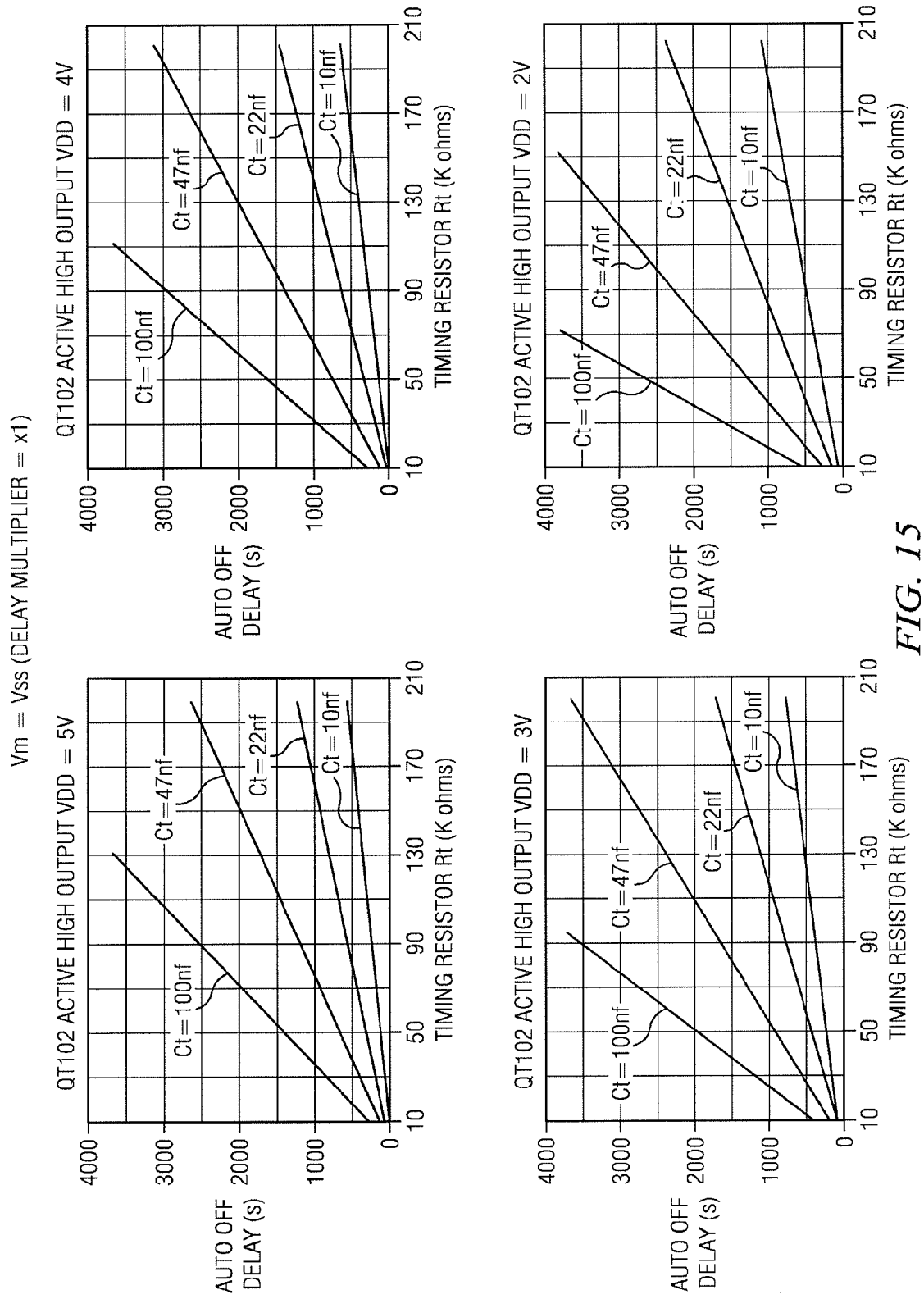
FIG. 15 schematically shows typical curves of auto-off delay as a function of timing resistor value for different capacitor values and different supply voltages for an active high output configuration.
Figure 16:
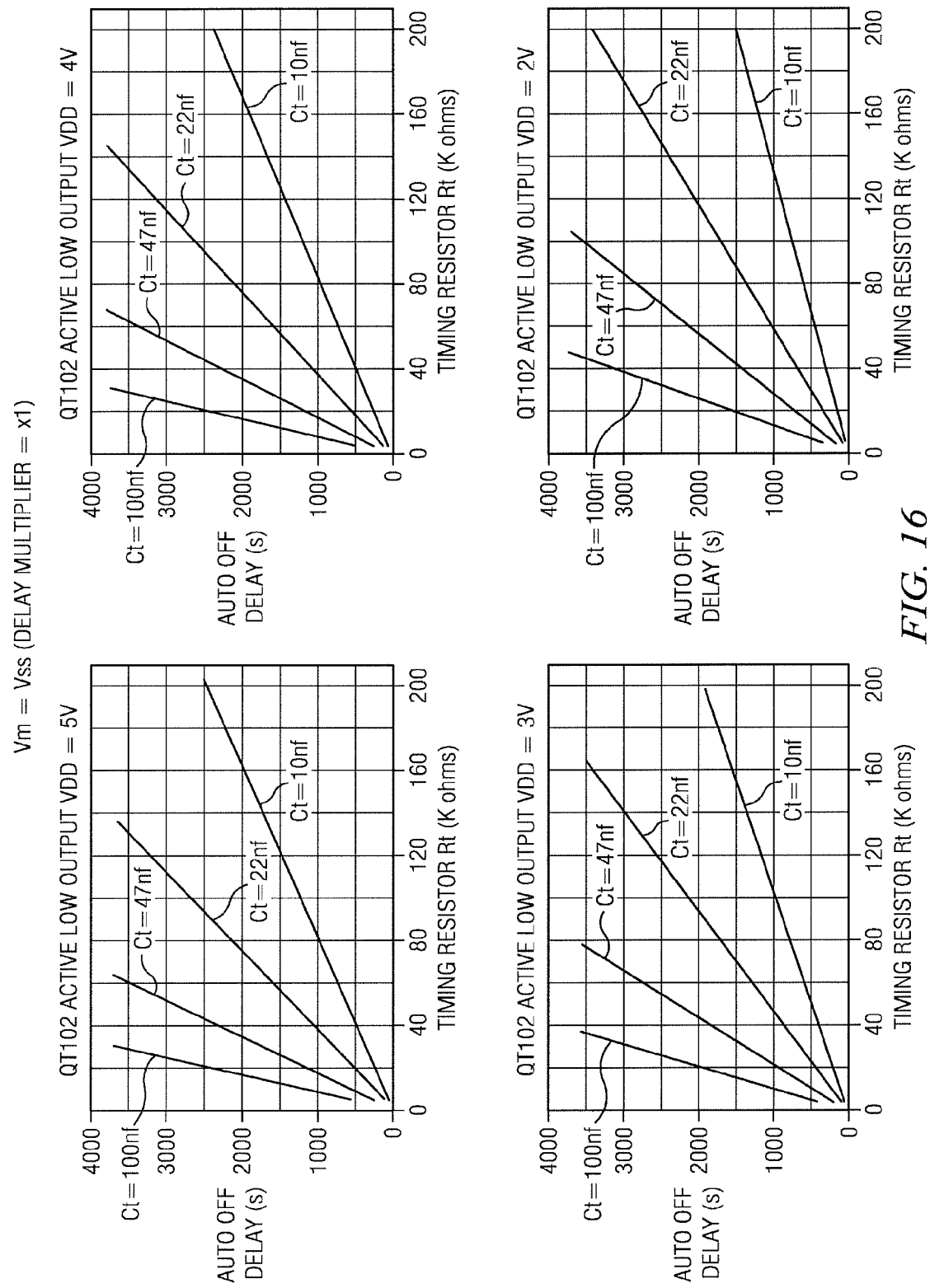
FIG. 16 schematically shows typical curves of auto-off delay as a function of timing resistor value for different capacitor values and different supply voltages for an active low output configuration.

As an alternative to calculation, Rt and Ct values may be selected from pre-calculated curves such as shown in FIGS. 15 and 16. FIGS. 15 and 16 show charts of typical curves of auto-off delay against resistor and capacitor values for active high (FIG. 15) and active low (FIG. 16) outputs at various values of VDD and for delay multiplier=×1.

Example Using Plot Shown in FIG. 15 or 16 to Calculate Rt and Ct

Requirements/Operating Parameters:
Active low output (Vop connected to V55)
Auto-off delay 10 hours
VDD=4V
Proceed as Follows:
1. Calculate Auto-off delay in seconds 10×60×60=36000. This value is outside of the range of the charts so use the ×24 multiplier (connect Rm to VDD).
   Note: this will decrease the key sensitivity, so in some circumstances it may be helpful to increase the value of Cs.
2. Find 36000/24=1500 on the 4V chart in FIG. 16
3. Read across to see appropriate Rt/Ct combinations. This example shows the following Rt/Ct combinations to be appropriate: 100 nF/10 kΩ, 47 nF/27 kSΩ, 22 nF/60 kΩ, and 10 nF/130 kΩ

Of course the Auto-off delay times given here are nominal and will vary slightly from chip to chip and with capacitor and resistor tolerance.

3.6 Examples of Typical Applications

Figure 17:
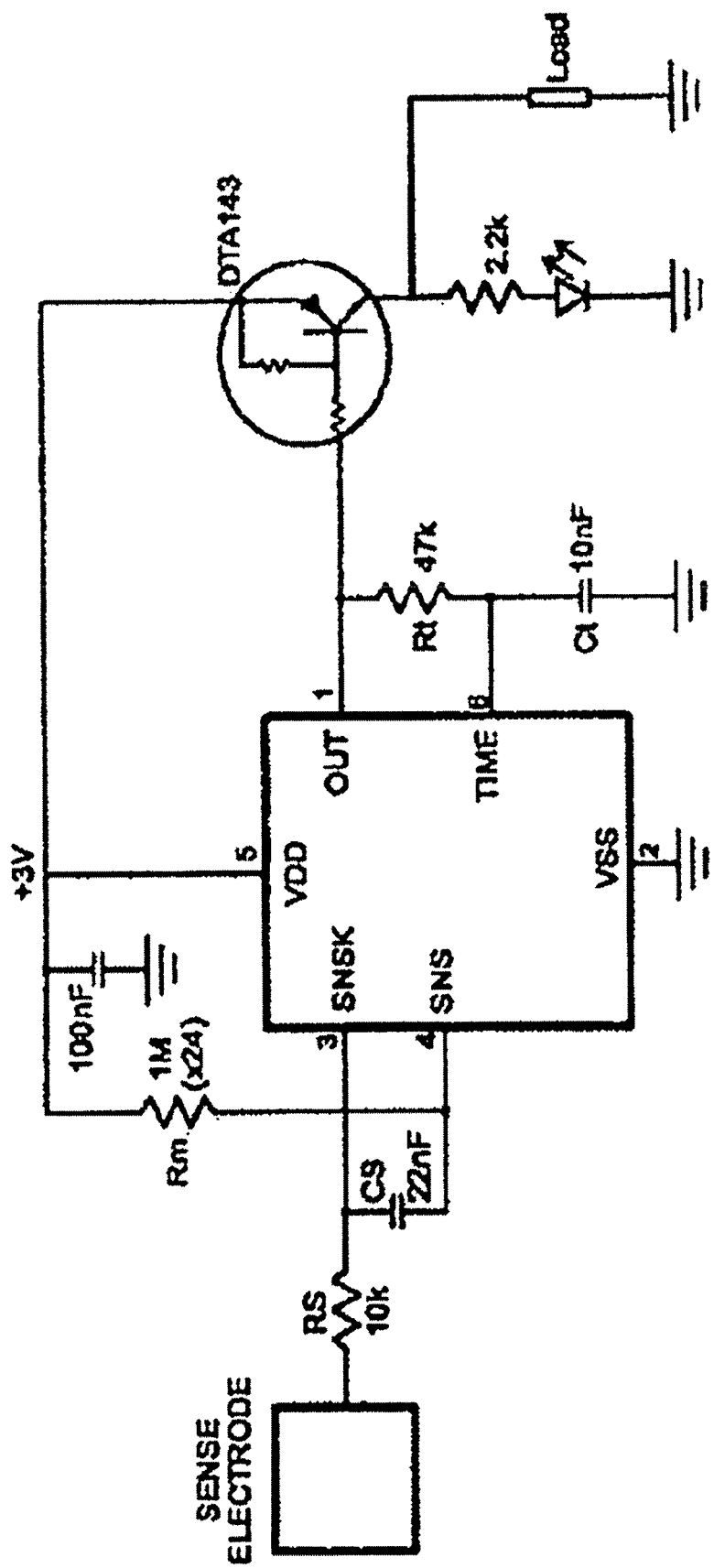
FIG. 17 schematically shows an example application of the chip shown in FIG. 1 in an active low output configuration driving a PNP transistor with an auto-off time of 3.33 hours.

FIG. 17 shows a first example application of a QT102 chip in particular embodiments. Here the QT102 is in an active low configuration and is shown driving a PNP transistor with an auto off time of 500 s×24 (3.33 hours).

The auto off time for the circuit configuration shown in FIG. 16 may be obtained from the VDD=3V chart in FIG. 16. Setting the delay multiplier to ×24 will decrease the key sensitivity, so it may be helpful in some cases to increase the value of Cs.

FIG. 17 shows a second example application of a QT102 chip in particular embodiments. Here the QT102 is in an active high configuration and is shown driving high impedance with an auto off time of 135 s×1 (2.25 minutes).

Figure 18:
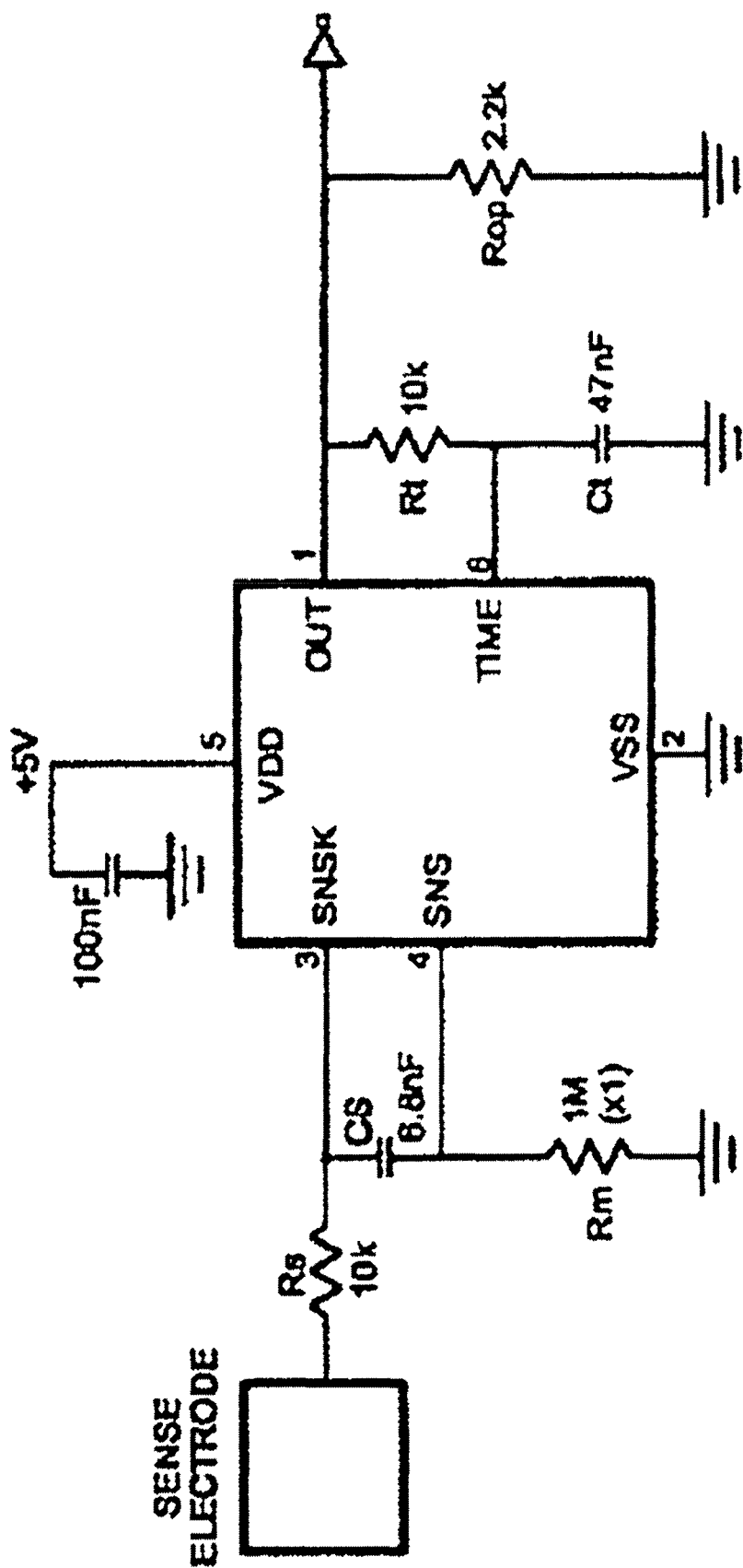
FIG. 18 schematically shows another example application of the chip shown in FIG. 1 in an active high output configuration driving a high impedance with an auto-off time of 135 seconds.

The auto off time for the circuit configuration shown in FIG. 18 may be obtained from the VDD=5V chart in FIG. 15.

4. Example Specifications for an Example QT102 Chip

An example chip incorporating particular embodiments may have the following specifications.

4.1 Suggested Maximum Operating Specifications
Operating temperature: −40° C. to +85° C.
Storage temperature: −55° C. to +125° C.
VDD: 0 to +6.5V
Maximum continuous pin current, any control or drive pin: ±20 mA
Short circuit duration to VSS, any pin: infinite
Short circuit duration to VDD, any pin: infinite
Voltage forced onto any pin: −0.6 to (VDD+0.6) Volts 4.2 Recommended Typical Operating Conditions
VDD: +2.0 to 5.5V
Short-term supply ripple+noise: ±5 mV
Long-term supply stability: ±100 mV
Cs value: 1 or 2 nF to 50 nF
Cx value: 5 to 20 pF 4.3 AC Specifications
VDD=3.0V, Cs=10 nF, Cx=5 pF, Ta=recommended range, unless otherwise noted

| Parameter | Description | Min | Typ | Max | Units | Notes |
|---|---|---|---|---|---|---|
| $T_{RC}$ | Recalibration time | | 250 | | ms | Cs and Cx dependent |
| $T_{PC}$ | Charge duration | | 2 | | μs | ±7.5% spread spectrum variation |
| $T_{PT}$ | Transfer duration | | 2 | | μs | ±7.5% spread spectrum variation |
| T | Time between end of burst and start of the next (Fast mode) | | 2.6 | | ms | |
| $T_{GZ}$ | Time between end of burst and start of the next (LP mode) | | 85 | | ms | Increases with reducing VDD |
| $T_{BL}$ | Burst length | | 20 | | ms | VDD, Cs and Cx dependent. See Section 2.2 for capacitor selection. |
| $T_R$ | Response time | | | 100 | ms | |

4.4 Signal Processing

| Description | Min | Typ | Max | Units | Notes |
|---|---|---|---|---|---|
| Threshold differential | | 10 | | counts | |
| Hysteresis | | 2 | | counts | |
| Consensus filter length | | 4 | | samples | |
| Recalibration timer | | 40 | | secs | Will vary with VDD |

4.5 DC Specifications

VDD=3.0V, Cs=10 nF, Cx=5 pF, Ta=recommended range, unless otherwise noted

| Parameter | Description | Min | Typ | Max | Units | Notes |
|---|---|---|---|---|---|---|
| $V_{pp}$ | Supply voltage | 2 | | 5/5.5 | V | |
| $I_{DD}$ | Supply current | | 5 | 60 | µA | Depending on supply and run mode |
| IddI | Supply current, LP Mode | | 23<br>37<br>90 | | µA | 2 V<br>3 V<br>5 V |
| $V_{DDS}$ | Supply turn-on slope | 100 | | | V/s | Required for proper start-up |
| $V_{IL}$ | Low input logic level | | | 0.8 | V | |
| $V_{HL}$ | High input logic level | 2.2 | | | V | |
| $V_{OL}$ | Low output voltage | | | 0.6 | V | OUT, 4TA sink |
| $V_{OH}$ | High output voltage | VDD-0.7 | | | V | OUT, 1 mA source |
| $I_{IL}$ | Input leakage current | | | ±1 | µA | |
| Cx | Load capacitance range | 0 | | 100 | pF | |
| $A_R$ | Acquisition resolution | | 9 | 14 | bits | |

4.6 Mechanical Dimensions

Figure 19:
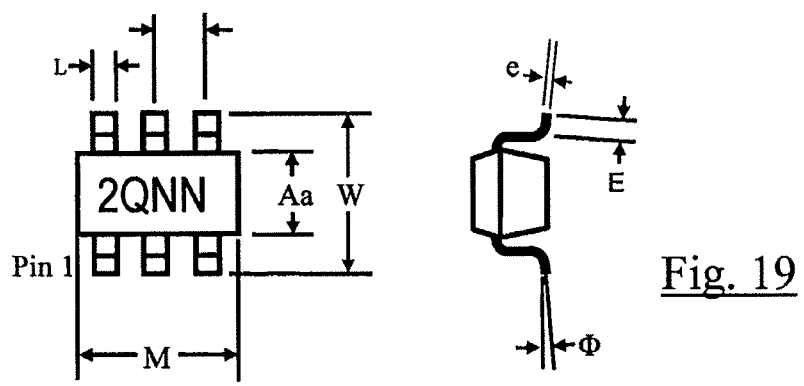
FIG. 19 schematically shows an implementation of the chip shown in FIG. 1 in an SOT23-6 package.
Figure 19:
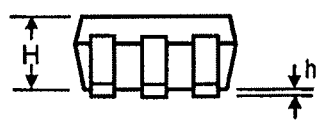

In one example embodiment a chip implementing the above-described QT102 chip functionality may be provided in an SOT23-6 package type. Referring to FIG. 19, the chip may thus have the following dimensions.

| | Package type: SOT23-6 | | | | | |
|---|---|---|---|---|---|---|
| | Millimeters | | | Inches | | |
| Symbol | Min | Max | Notes | Min | Max | Notes |
| M | 2.8 | 3.10 | | 0.110 | 0.122 | |
| W | 2.6 | 3.0 | | 0.102 | 0.118 | |
| Aa | 1.5 | 1.75 | | 0.059 | 0.069 | |
| H | 0.9 | 1.3 | | 0.035 | 0.051 | |
| h | 0.0 | 0.15 | | 0 | 0.006 | |
| D | — | — | 0.95 BSC | — | — | 0.038 BSC |
| L | 0.35 | 0.5 | | 0.014 | 0.02 | |
| E | 0.35 | 0.55 | | 0.014 | 0.022 | |
| e | 0.09 | 0.2 | | 0.004 | 0.008 | |
| Φ | 0° | 10° | | 0° | 10° | |

Figure 20:
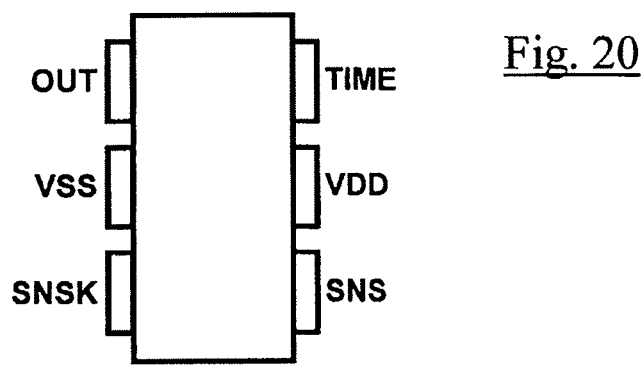
FIG. 20 schematically shows a pin diagram for an implementation of the chip shown in FIG. 1 in an SOT23-6 package.

A QT102 chip provided in an SOT23-6 package type may have a pin arrangement as schematically indicated in FIG. 20.

4.7 Moisture Sensitivity Level (MSL)

A chip implementing the above-described QT102 chip functionality may be rated as follows:

| MSL Rating | Peak Body Temperature | Specifications |
|---|---|---|
| MSL1 | 260° C. | 1PC/JEDEC J-STD-020C |

Thus, in particular embodiments, the QT102 charge-transfer (QT) touch sensor is a self-contained digital IC capable of detecting near-proximity or touch. It may project a touch or proximity field through any dielectric like glass, plastic, stone, ceramic, and even most kinds of wood. It can also turn small metal-bearing objects into intrinsic sensors, making them responsive to proximity or touch. This capability, coupled with its ability to self calibrate, can lead to entirely new product concepts. It may be implemented in human interfaces, like control panels, appliances, toys, lighting controls, or anywhere a mechanical switch or button may be found.

The QT102 example embodiment may be seen as a single key chip combining a touch-on/touch-off toggle mode with timeout and timing override functions, oriented towards power control of small appliances and battery-operated products, for example. With a small low-cost SOT-23 package, this device can suit almost any product needing a power switch or other toggle-mode controlled function.

An environmentally friendly ("green") feature of the QT102 is the timeout function, which can turn off power after a specified time delay ranging from minutes to hours. Furthermore, external "sustain" and "cancel" functions permit designs where the timeout needs to be extended further or terminated early. A user's interaction with a product might trigger a "sustain" input, prolonging the time to shutoff. A safety sensor, such as a tip-over switch on a space heater, can feed the "cancel" function to terminate early.

The QT102 embodiment(s) features automatic self-calibration, drift compensation, and spread-spectrum burst modulation. The device can in some cases bring inexpensive, easy-to-implement capacitive touch sensing to all kinds of appliances and equipment, from toys to coffee makers. The small, low cost SOT-23 package lets this unique combination of features reside in almost any product.

The QT102 chip embodying particular embodiments may be summarized as having the following operational features/application parameters:

Number of keys: One touch on/touch off (toggle mode), plus hardware programmable auto switch-off/switch-off delay and external cancel
  Technology: Spread-spectrum charge-transfer (direct mode)
  Example key outline sizes: 6 mm×6 mm or larger (generally panel thickness dependent); widely different sizes and shapes possible
  Example electrode design: Solid or ring electrode shapes
  PCB Layers required: One
  Example electrode materials: Etched copper, silver, carbon, Indium Tin Oxide (ITO), Orgacon®
  Example electrode substrates: PCB, FPCB, plastic films, glass Example panel materials: Plastic, glass, composites, painted surfaces (including relatively low particle density metallic paints)

Example panel thickness: Up to 50 mm glass, 20 mm plastic (generally electrode size dependent)

Key sensitivity: Settable via external capacitor

Interface: Digital output, active high or active low (hardware configurable)

Moisture tolerance: Good

Power: 2V~5.5V; drawing, for example, 23 µA at 2V

Example package: SOT23-6 (3×3 mm) RoHS compliant

Signal processing: Self-calibration, auto drift compensation, noise filtering

Example Applications: Power switch replacement in countertop appliances, irons, battery powered toys, heaters, lighting controls, automotive interior lighting, commercial and industrial equipment such as soldering stations and cooking equipment In particular embodiments, the above-described sensors may be used in apparatus or devices with one touch key. In particular embodiments the sensing element of the sensor may include more than one key, for example two, three, or more keys.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
   a sensing element; and
   one or more computer-readable non-transitory storage media embodying logic that is operable when executed to:
   determine an amount of time that has elapsed since the sensing element last detected a change of capacitance indicative of an object being in proximity to the sensing element; and
   if the amount of time that has elapsed exceeds a predetermined time duration, then initiate a particular function of the apparatus.

2. The apparatus of claim 1, wherein the particular function comprises deactivation of measurement of changes in capacitance by the sensing element.

3. The apparatus of claim 1, wherein the particular function comprises recalibration of measurement of changes in capacitance by the sensing element.

4. The apparatus of claim 1, wherein the logic is further operable to calculate the predetermined time duration based on one of a plurality of power supply voltages or an output voltage of the sensing element.

5. The apparatus of claim 1, wherein the logic is further operable to calculate the predetermined time duration based on one of a plurality of delay multipliers determined by a polarity of a voltage pulse.

6. The apparatus of claim 1, wherein the particular function comprises turning off the apparatus.

7. The apparatus of claim 1, further comprising a control circuit.

8. The apparatus of claim 7, wherein the sensing element comprises a pattern of electrodes within a touch screen, the electrodes being coupled to the control circuit.

9. The apparatus of claim 8, wherein the electrodes comprise indium tin oxide (ITO).

10. A method comprising:
    monitoring, by a control circuit, capacitance measurements of a sensing element of an apparatus;
    determining an amount of time that has elapsed since the sensing element last detected a change of capacitance indicative of an object being in proximity to the sensing element; and
    if the amount of time that has elapsed exceeds a predetermined time duration, then initiating a particular function of the apparatus.

11. The method of claim 10, wherein the particular function comprises deactivating measurement of changes in capacitance by the sensing element.

12. The method of claim 10, wherein the particular function comprises recalibrating measurement of changes in capacitance by the sensing element.

13. The method of claim 10, further comprising calculating the predetermined time duration based on one of a plurality of power supply voltages or an output voltage of the sensing element.

14. The method of claim 10, further comprising calculating the predetermined time duration based on one of a plurality of delay multipliers determined by a polarity of a voltage pulse.

15. The method of claim 10, wherein the particular function comprises turning off power to the apparatus.

16. A computer-readable non-transitory storage media embodying logic that is operable when executed to:
    monitor capacitance measurements of a sensing element of an apparatus;
    determine an amount of time that has elapsed since the sensing element last detected a change of capacitance indicative of an object being in proximity to the sensing element; and
    if the amount of time that has elapsed exceeds a predetermined time duration, then initiate a particular function of the apparatus.

17. The media of claim 16, wherein the particular function comprises deactivation of measurement of changes in capacitance by the sensing element.

18. The media of claim 16, wherein the particular function comprises recalibration of measurement of changes in capacitance by the sensing element.

19. The media of claim 16, wherein the logic is further operable to calculate the predetermined time duration based on one of a plurality of power supply voltages or an output voltage of the sensing element.

20. The media of claim 16, wherein the logic is further operable to calculate the predetermined time duration based on one of a plurality of delay multipliers determined by a polarity of a voltage pulse.

* * * * *

UNITED STATES PATENT AND TRADEMARK OFFICE
CERTIFICATE OF CORRECTION

PATENT NO. : 9,081,572 B2  
APPLICATION NO. : 14/299032  
DATED : July 14, 2015  
INVENTOR(S) : Harald Philipp and Kevin Snoad Page 1 of 1

It is certified that error appears in the above-identified patent and that said Letters Patent is hereby corrected as shown below:

On the title page, item 72, Col. 1, line 2, (Inventors), delete "Chicester" and insert -- Chichester --, therefor.

In the specification

Col. 7, line 16, delete "recal(ibration)"." and insert -- recalibration" --, therefor.

Col. 8, line 32, delete "RF 1." and insert -- RFI. --, therefor.

Col. 10, line 37, delete "low" and insert -- low. --, therefor.

Col. 13, line 53, delete "130kΩ" and insert -- 130kΩ. --, therefor.

Col. 13, line 61, delete "(3.33 hours)" and insert -- (3.33 hours). --, therefor.

Col. 17, line 18, delete "equipment" and insert -- equipment. --, therefor.

Signed and Sealed this  
Eighth Day of December, 2015

Michelle K. Lee  
*Director of the United States Patent and Trademark Office*